United States Patent
Krauss et al.

(10) Patent No.: US 7,724,488 B2
(45) Date of Patent: May 25, 2010

(54) METHOD FOR CONTROLLING AN ELECTRONIC OVERCURRENT TRIP FOR LOW-VOLTAGE CIRCUIT BREAKERS

(75) Inventors: Andreas Krauss, Berlin (DE); Klaus Neidhardt, Berlin (DE); Andreas Pancke, Berlin (DE); Ilka Redmann, Falkensee (DE)

(73) Assignee: Siemens Aktiengesellschaft, Munich (DE)

( * ) Notice: Subject to any disclaimer, the term of this patent is extended or adjusted under 35 U.S.C. 154(b) by 1111 days.

(21) Appl. No.: 10/571,562

(22) PCT Filed: Aug. 24, 2004

(86) PCT No.: PCT/DE2004/001909

§ 371 (c)(1),
(2), (4) Date: Mar. 10, 2006

(87) PCT Pub. No.: WO2005/027292

PCT Pub. Date: Mar. 24, 2005

(65) Prior Publication Data

US 2007/0086139 A1 Apr. 19, 2007

(30) Foreign Application Priority Data

Sep. 12, 2003 (DE) ............................... 103 43 350

(51) Int. Cl.
*H02H 3/08* (2006.01)
*H02H 9/02* (2006.01)
(52) U.S. Cl. ..................... 361/93.2; 361/93.1
(58) Field of Classification Search ................. 361/93.2
See application file for complete search history.

(56) References Cited

U.S. PATENT DOCUMENTS

| 4,347,581 | A | | 8/1982 | Yamaura et al. |
| 4,456,867 | A | * | 6/1984 | Mallick et al. ............... 318/778 |
| 4,767,996 | A | * | 8/1988 | Jinzenji ...................... 324/522 |
| 5,036,477 | A | * | 7/1991 | Forster et al. .................. 702/97 |
| 5,315,293 | A | * | 5/1994 | Kamiya ....................... 340/664 |
| 5,353,188 | A | * | 10/1994 | Hatakeyama ................. 361/97 |

(Continued)

FOREIGN PATENT DOCUMENTS

JP          02 101921 A     4/1990

(Continued)

OTHER PUBLICATIONS

International Search Report (PCT/ISA/210).

(Continued)

*Primary Examiner*—Ronald W Leja
*Assistant Examiner*—Dharti H Patel
(74) *Attorney, Agent, or Firm*—Harness, Dickey & Pierce, P.L.C.

(57) ABSTRACT

A method is disclosed for controlling an electronic overcurrent trip for low-voltage circuit breakers. According to the method, digitized signals for the electricity values are generated and evaluated, and a tripping device providing short-circuit protection is activated when an overcurrent event is assumed to take place based on the evaluation. According to the method, signals whose electricity value does not lie between the electricity values of the previous signal and the subsequent signal, or whose electricity value does not correspond to the electricity values of the previous signal or the subsequent signal, are rated as potentially erroneous signals and are tested by use of additional criteria.

19 Claims, 1 Drawing Sheet

U.S. PATENT DOCUMENTS

| | | | |
|---|---|---|---|
| 6,434,715 B1 * | 8/2002 | Andersen | 714/39 |
| 6,625,550 B1 * | 9/2003 | Scott et al. | 702/58 |
| 7,016,174 B2 * | 3/2006 | Dougherty | 361/93.1 |
| 2003/0063421 A1 * | 4/2003 | Smith et al. | 361/93.2 |
| 2003/0179528 A1 * | 9/2003 | Fletcher et al. | 361/93.2 |

FOREIGN PATENT DOCUMENTS

| | | |
|---|---|---|
| JP | 02101921 | 4/1990 |
| JP | 07007838 | 1/1995 |
| JP | 07 007838 A | 10/1995 |
| JP | 08 214445 A | 8/1996 |
| JP | 08214445 | 8/1996 |

OTHER PUBLICATIONS

Written Opinion (PCT/ISA/237).

German Translation Aid.

* cited by examiner

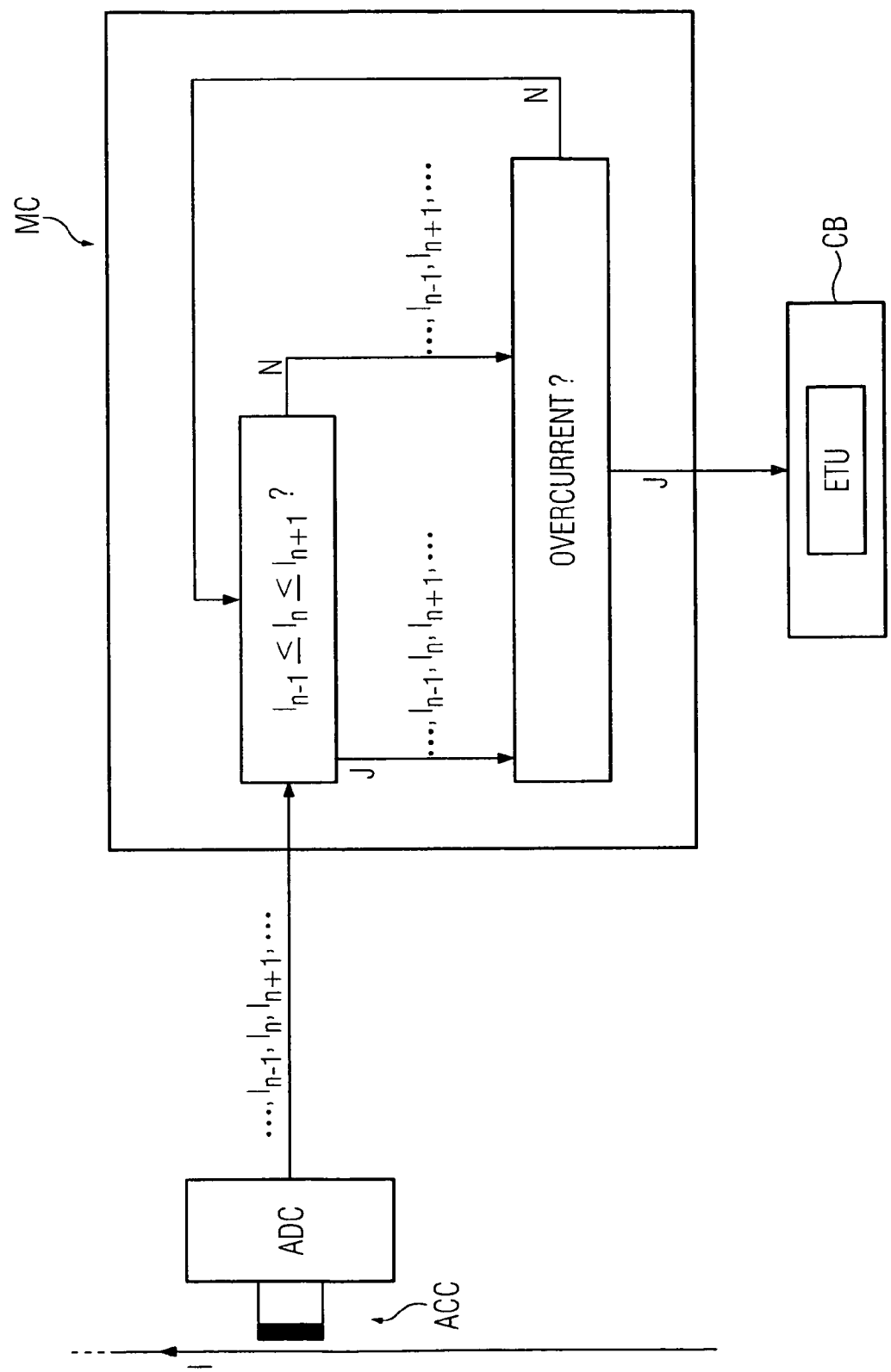

METHOD FOR CONTROLLING AN ELECTRONIC OVERCURRENT TRIP FOR LOW-VOLTAGE CIRCUIT BREAKERS

This application is the national phase under 35 U.S.C. §371 of PCT International Application No. PCT/DE2004/001909 which has an International filing date of Aug. 24, 2004, which designated the United States of America and which claims priority on German Patent Application number 103 43 350.3 filed Sep. 12, 2003, the entire contents of which are hereby incorporated herein by reference.

FIELD

The invention generally relates to a method for controlling an electronic overcurrent release for low-voltage circuit breakers.

BACKGROUND

Overcurrent releases are used in low-voltage circuit breakers to detect an overcurrent event (for example a short circuit) in good time when such an event occurs, and/or to prevent damage or destruction of the low-voltage circuit breaker by a suitable device/method, for example a device/method for immediate disconnection of the contacts.

The current flowing through the low-voltage circuit breaker is determined for this purpose. According to the prior art, this can be achieved, for example, by way of air-cored coils which are arranged close to the current-carrying elements of the low-voltage circuit breaker. The conductor through which current flows produces a magnetic field whose rate of change leads to a voltage in the coil. This voltage signal is normally converted by means of an analog/digital converter to a digital signal, which is integrated and represents a parameter for the current flowing through the low-voltage circuit breaker within a time interval.

This digitized current signal is supplied to a microprocessor, which evaluates the individual, successive current signals. If a more than proportional current rise (an overcurrent event) is now deduced from the digitized current signal, the microprocessor produces a signal which activates a release for short-circuit protection.

One particular problem in the case of electronic overcurrent releases is their susceptibility to interference. The introduction of interference through power supply units or EMC influences can corrupt the digital current signals. The use of capacitors is known, by way of example, in order to make it possible to filter out corrupted current signals.

However, a highly complex and thus costly filter mechanism would be required in order to provide the capability to effectively filter out all interference signals. For this reason, it is known for interference signals to be filtered out not only by way of electrical circuits (for example capacitors) but also after digitization of the current signals. Filtering of interference signals is important for an assessment of whether an overcurrent event has occurred, because spurious tripping of the overcurrent release could occur if the interference signals were not filtered.

In order to filter the already digitized current signals, it is known for the value (current level) of a digitized current signal to be compared with three times the value of the previous digitized current signal. If the current level is more than three times the previous current level, this was filtered out according to the prior art, since it was assumed that the current level had been influenced by interference. Filtering includes that this (filtered) current level is no longer used for current detection and calculation, and thus for assessment of whether an overcurrent event has occurred.

The known method has the disadvantage that interference can be identified only when the current signals are not greater than one third of the measurement range of the A/D converter. Otherwise, all interference is identified as being valid and is included in the current detection and calculation, so that spurious tripping of the overcurrent circuit breaker can occur. A further disadvantage is that the only interference which can be identified is that which has a considerable influence on the current levels (three times the previous current level). Relatively minor interference which does not reach three times the previous current level can, however, likewise lead to spurious tripping of the overcurrent release, if it occurs repeatedly.

SUMMARY

An object of at least one embodiment of the present invention is thus to specify a method for controlling an electronic overcurrent release for low-voltage circuit breakers, which is less susceptible to interference caused by power supply units and EMC influences.

One particular advantage of the method according to at least one embodiment of the invention for controlling an electronic overcurrent release for low-voltage circuit breakers is that this method is less susceptible to interference caused by power supply units or EMC influences. Since signals whose current level is not between the current levels of the previous signal and of the subsequent signal, or whose current level does not match the current levels of the previous signal or of the subsequent signal, are classified as being potentially incorrect signals and are checked by way of further criteria, it is also possible to identify and filter out that interference which has less influence on the digitized current levels than three times the previous current level.

BRIEF DESCRIPTION OF THE DRAWING

FIG. 1 is a schematic illustration of an example embodiment of the subject matter of this application.

DETAILED DESCRIPTION OF THE EXAMPLE EMBODIMENTS

One example embodiment variant provides that those signals which are classified as being potentially incorrect and whose current levels exceed the current levels of the previous signal by a predetermined value are not included in the evaluation for the assessment of an overcurrent event.

Thus, those current levels which are between the current levels of the previous signal and of the subsequent signal or match the current levels of the previous signal or of the subsequent signal are always included in the evaluation for the assessment of an overcurrent event since, according to at least one embodiment of the invention, it is assumed that these signals are not subject to interference from power supply units or EMC influences which may result in spurious tripping of the overcurrent release. Those signals which do not satisfy the criteria mentioned above are, however, initially regarded as being potentially incorrect and checked by at least one further criterion to determine whether these signals are subject to interference from power supply units or EMC influences. This can be assumed to be the case if the current level of a potentially incorrect signal exceeds the current level of a previous signal by an amount that is defined in advance. This amount is, for example, dependent on the power data of the low-voltage circuit breaker, on the measurement range of the A/D converter and on the time interval between the current or voltage measurements.

The digitized current signal are preferably generated for the root mean square values of the current flowing through the low-voltage circuit breaker.

The assessment and filtering of the digitized current signals are preferably carried out on the basis of the criteria mentioned above by way of a data processing appliance. In one particular example embodiment variant, the data processing appliance is a microprocessor. The method described above makes it possible to considerably reduce the susceptibility of low-voltage circuit breakers to interference caused by power supply units or EMC influences.

The invention is not restricted to the example embodiments described here. In fact, it is possible to provide further embodiment variants by combination and modification of the stated devices, steps and features, without departing from the scope of the invention.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for controlling an electronic overcurrent release for low-voltage circuit breakers, comprising:
   generating and evaluating digitized signals for current values; and
   activating a release for short-circuit protection as a consequence of the evaluation when an overcurrent event occurs, wherein
   signals, whose current level is not between current levels of a preceding signal and of a subsequent signal are classified as being potentially incorrect, and are checked using further criteria.

2. The method as claimed in claim 1, wherein the signals classified as being potentially incorrect and whose current levels exceed the current levels of the preceding signal by a predetermined value are not included in the evaluation for the assessment of an overcurrent event.

3. The method as claimed in claim 1, wherein the digitized signals are generated for the root mean square values of the current flowing through the low-voltage circuit breaker.

4. The method as claimed in claim 1, wherein the current levels are determined by measurement of voltages which are produced in coils.

5. The method as claimed in claim 1, wherein the digitized signals are produced by an A/D converter, which converts the voltages which are produced in coils to digital signals.

6. The method as claimed in claim 1, wherein the digitized signals are processed by a microprocessor.

7. The method as claimed in claim 2, wherein the digitized signals are generated for the root mean square values of the current flowing through the low-voltage circuit breaker.

8. The method as claimed in claim 2, wherein the current levels are determined by measurement of voltages which are produced in coils.

9. The method as claimed in claim 2, wherein the digitized signals are produced by an A/D converter, which converts the voltages which are produced in coils to digital signals.

10. The method as claimed in claim 2, wherein the digitized signals are processed by a microprocessor.

11. The method as claimed in claim 3, wherein the current levels are determined by measurement of voltages which are produced in coils.

12. The method as claimed in claim 3, wherein the digitized signals are produced by an A/D converter, which converts the voltages which are produced in coils to digital signals.

13. The method as claimed in claim 3, wherein the digitized signals are processed by a microprocessor.

14. A method for controlling an electronic overcurrent release for low-voltage circuit breakers, in which digitized signals for the current values are generated and evaluated and a release for short-circuit protection is activated as a consequence of the evaluation when an overcurrent event occurs, the method comprising:
   classifying signals, with a current level which is not between the current levels of the preceding signal and those of the subsequent signal as being potentially incorrect; and
   checking the signals classified as being potentially incorrect by further criteria.

15. The method as claimed in claim 14, wherein the signals classified as being potentially incorrect and whose current levels exceed the current levels of the preceding signal by a predetermined value are not included in the evaluation for the assessment of an overcurrent event.

16. The method as claimed in claim 14, wherein the digitized signals are generated for the root mean square values of the current flowing through the low-voltage circuit breaker.

17. A method for controlling an electronic overcurrent release for low-voltage circuit breakers, comprising:
   generating and evaluating digitized signals for current values;
   activating a release for short-circuit protection as a consequence of the evaluation when an overcurrent event occurs;
   classifying signals, with a current level which is not between the current levels of the preceding signal and those of the subsequent signal as being potentially incorrect; and
   checking the signals classified as being potentially incorrect by further criteria.

18. The method as claimed in claim 17, wherein the signals classified as being. potentially incorrect and whose current levels exceed the current levels of the preceding signal by a predetermined value are not included in the evaluation for the assessment of an overcurrent event.

19. The method as claimed in claim 17, wherein the digitized signals are generated for the root mean square values of the current flowing through the low-voltage circuit breaker.

* * * * *